United States Patent
Lee et al.

(10) Patent No.: US 12,312,690 B2
(45) Date of Patent: May 27, 2025

(54) SEMICONDUCTOR PROCESSING APPARATUS AND SEMICONDUCTOR PROCESSING METHOD USING THE SAME

(71) Applicant: Samsung Electronics Co., Ltd., Suwon-si (KR)

(72) Inventors: Minju Lee, Hwaseong-si (KR); Sookyeom Yong, Gunpo-si (KR); Sangyub Ie, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 399 days.

(21) Appl. No.: 17/714,363

(22) Filed: Apr. 6, 2022

(65) Prior Publication Data
US 2023/0002903 A1 Jan. 5, 2023

(30) Foreign Application Priority Data
Jul. 5, 2021 (KR) .................... 10-2021-0087758

(51) Int. Cl.
C23C 16/455 (2006.01)
C23C 16/458 (2006.01)
H01L 21/673 (2006.01)

(52) U.S. Cl.
CPC .. *C23C 16/45578* (2013.01); *C23C 16/45544* (2013.01); *C23C 16/4583* (2013.01); *H01L 21/67303* (2013.01)

(58) Field of Classification Search
CPC .......... C23C 16/4583; C23C 16/45546; C23C 16/45544; C23C 16/45578; H01L 21/67303; H01L 21/6719
See application file for complete search history.

(56) References Cited

U.S. PATENT DOCUMENTS

| | | | |
|---|---|---|---|
| 6,444,262 B1 | 9/2002 | Kitamura et al. | |
| 10,950,457 B2 | 3/2021 | Yoshida et al. | |
| 2009/0203227 A1* | 8/2009 | Hasebe | H01L 21/31612 257/E21.24 |
| 2009/0291566 A1* | 11/2009 | Ueno | H01L 21/67769 118/724 |
| 2012/0100722 A1* | 4/2012 | Asai | H01L 21/0337 438/758 |
| 2012/0156886 A1 | 6/2012 | Shirako et al. | |
| 2012/0199067 A1 | 8/2012 | Morozumi et al. | |
| 2019/0157049 A1* | 5/2019 | Sato | C23C 16/45504 |
| 2019/0393045 A1* | 12/2019 | Yoshida | H01L 21/0217 |
| 2021/0292892 A1* | 9/2021 | Hirano | C23C 16/52 |

FOREIGN PATENT DOCUMENTS

| | | |
|---|---|---|
| JP | 4498210 B2 | 7/2010 |
| KR | 101952549 B1 | 2/2019 |
| KR | 102165711 B1 | 10/2020 |

* cited by examiner

*Primary Examiner* — Joseph A Miller, Jr.
(74) *Attorney, Agent, or Firm* — Muir Patent Law, PLLC

(57) ABSTRACT

A semiconductor processing apparatus includes an outer tube, an inner tube in the outer tube and providing a process space, and a nozzle between the outer tube and the inner tube. The nozzle provides an internal passage. The inner tube provides a slit. The nozzle provides a plurality of holes. The plurality of holes are vertically spaced apart from each other. The slit vertically extends to expose at least two of the plurality of holes. The internal passage is connected to the process space through the slit and the plurality of holes.

17 Claims, 17 Drawing Sheets

SEMICONDUCTOR PROCESSING APPARATUS AND SEMICONDUCTOR PROCESSING METHOD USING THE SAME

CROSS-REFERENCE TO RELATED APPLICATION

This U.S. nonprovisional application claims priority under 35 U.S.C § 119 to Korean Patent Application No. 10-2021-0087758 filed on Jul. 5, 2021 in the Korean Intellectual Property Office, the disclosure of which is hereby incorporated by reference in its entirety.

BACKGROUND

The present inventive concepts relate to a semiconductor processing apparatus and a semiconductor processing method using the same, and more particularly, to a semiconductor processing apparatus minimizing a process variation in a semiconductor process and a semiconductor processing method using the same.

A semiconductor device may be fabricated through various processes. For example, the semiconductor device may be manufactured through a photolithography process, an etching process, a deposition process, and a plating process. In the deposition process, a vertical type semiconductor processing apparatus may be used to process a plurality of wafers at the same time. Such semiconductor processing apparatus may be called a vertical furnace. A gas may be injected in a semiconductor processing apparatus in which wafers are stacked on each other. A nozzle may be used to inject the gas. The injected gas may react with the wafers for various processes. For example, the injected gas may be used in an atomic layer deposition (ALD) process on wafers in a semiconductor processing apparatus.

SUMMARY

Some embodiments of the present inventive concepts provide a semiconductor processing apparatus configured to supply a wafer with a process gas whose amount is large even at a certain flow rate and a semiconductor processing method using the same.

Some embodiments of the present inventive concepts provide a semiconductor processing apparatus capable of minimizing a process variation at a wafer and a semiconductor processing method using the same.

Some embodiments of the present inventive concepts provide a semiconductor processing apparatus configured to uniformly supply a process gas to all of wafers disposed in upper and lower portions of a boat.

The object of the present inventive concepts is not limited to the mentioned above, and other objects which have not been mentioned above will be clearly understood to those skilled in the art from the following description.

According to some embodiments of the present inventive concepts, a semiconductor processing apparatus may comprise: an outer tube; an inner tube in the outer tube, the inner tube providing a process space; and a nozzle between the outer tube and the inner tube. The nozzle may provide an internal passage. The inner tube may provide a slit. The nozzle may provide a plurality of holes. The plurality of holes may be vertically spaced apart from each other. The slit may vertically extend to expose at least two holes of the plurality of holes. The internal passage may be connected to the process space through the slit and the plurality of holes.

According to some embodiments of the present inventive concepts, a semiconductor processing apparatus may comprise: an outer tube; an inner tube in the outer tube; and a nozzle that vertically extends between the outer tube and the inner tube. The inner tube may provide a slit that extends vertically. The nozzle may provide a hole exposed through the slit. An aspect ratio of the slit may be greater than about 1. The nozzle may be spaced apart from an outer surface of the inner tube.

According to some embodiments of the present inventive concepts, a semiconductor processing method may comprise: placing a wafer onto a boat; inserting the boat into an inner tube; supplying a process gas to a nozzle that is outside the inner tube; allowing the process gas to flow into the inner tube from the nozzle; and causing the process gas to process the wafer. The step of allowing the process gas to flow into the inner tube from the nozzle may include: allowing the process gas to escape from the nozzle through a plurality of holes formed in the nozzle; and allowing the process gas to move into the inner tube through a slit formed in the inner tube. The slit may vertically extend to horizontally overlap at least two of the plurality of holes.

Details of other example embodiments are included in the description and drawings.

DETAILED DESCRIPTION OF EMBODIMENTS

Figure 1:
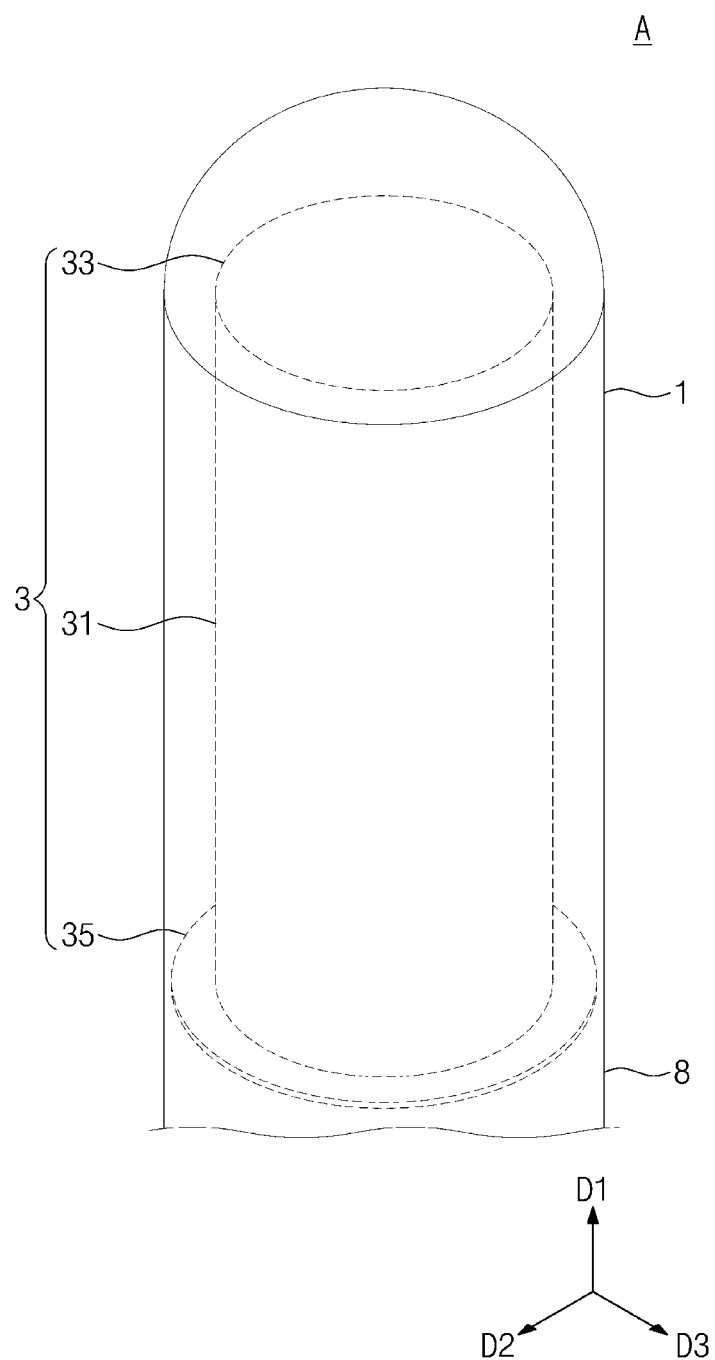
FIG. 1 illustrates a perspective view showing a semiconductor processing apparatus according to some embodiments of the present inventive concepts.

The following will now describe some embodiments of the present inventive concepts with reference to the accompanying drawings. Like reference numerals may indicate like components throughout the description.

Figure 2:
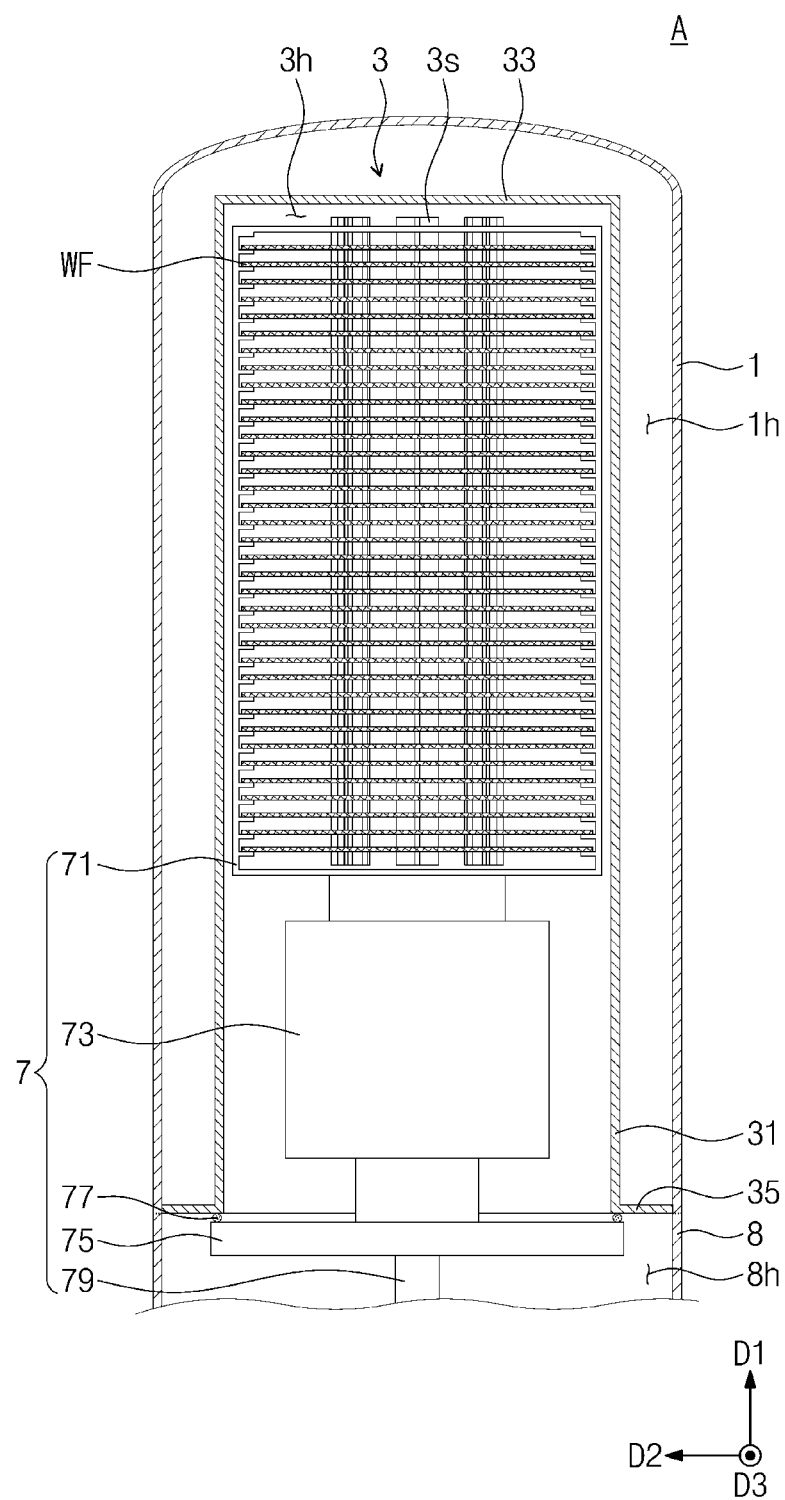
FIG. 2 illustrates a cross-sectional view showing a semiconductor processing apparatus according to some embodiments of the present inventive concepts.
Figure 3:
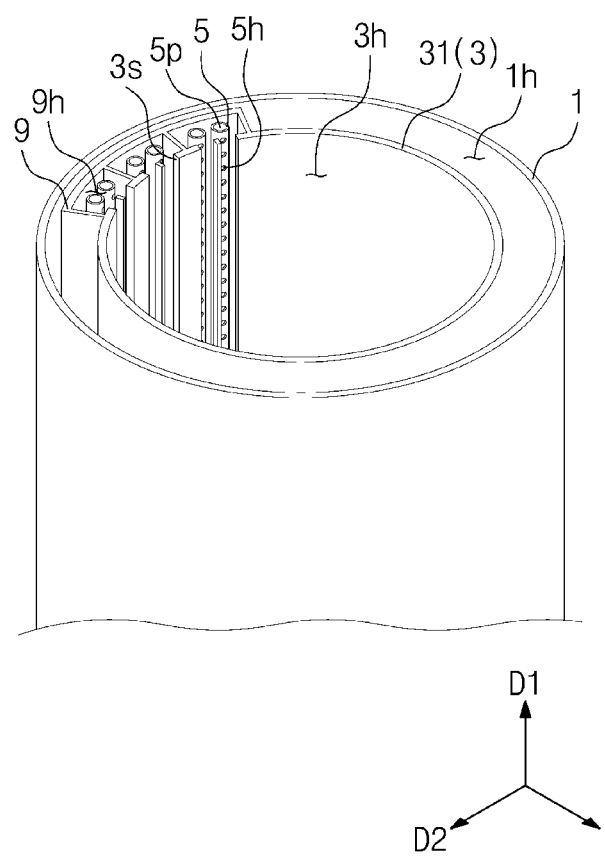
FIGS. 3 and 4 illustrate a cutting perspective view partially showing a semiconductor processing apparatus according to some embodiments of the present inventive concepts.
Figure 4:
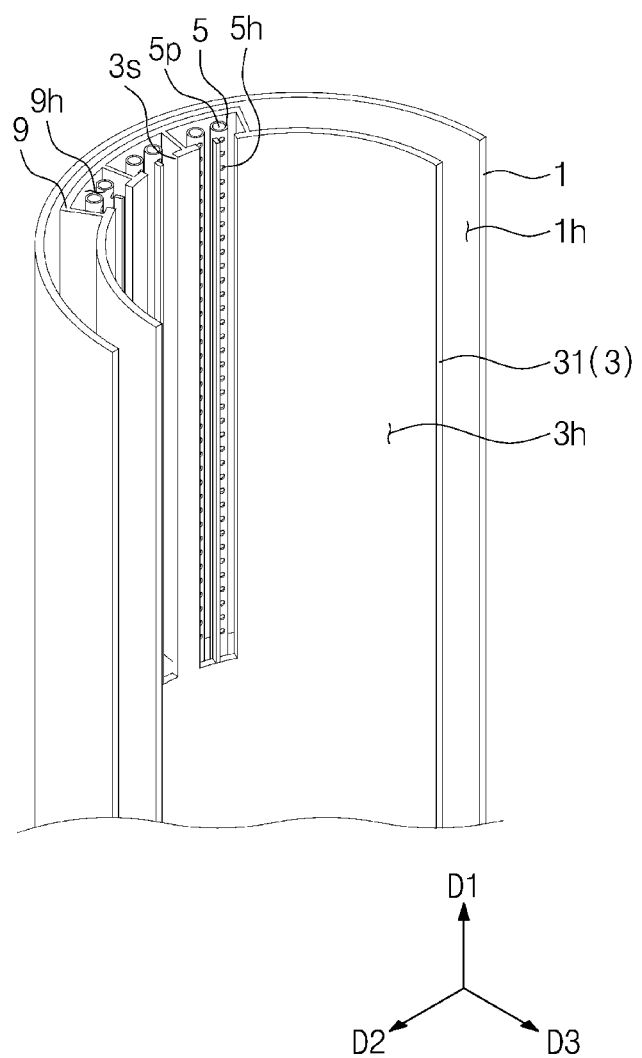

FIG. 1 illustrates a perspective view showing a semiconductor processing apparatus according to some embodiments of the present inventive concepts. FIG. 2 illustrates a cross-sectional view showing a semiconductor processing apparatus according to some embodiments of the present inventive concepts. FIGS. 3 and 4 illustrate a cutting perspective view partially showing a semiconductor processing apparatus according to some embodiments of the present inventive concepts.

In this description below, symbols D1, D2, and D3 of FIG. 1 may respectively represent a first direction, a second direction that intersects the first direction D1, and a third direction that intersects each of the first direction D1 and the second direction D2. The first direction D1 may be called an upward direction, and a reverse direction to the first direction D1 may be called a downward direction. Each of the second and third directions D2 and D3 may be called a horizontal direction.

Referring to FIGS. 1 to 4, a semiconductor processing apparatus A may be provided. The semiconductor processing apparatus A may be a device for forming a thin layer on a semiconductor substrate. In some embodiments, the semiconductor processing apparatus A may be a device that performs a deposition process on a wafer WF. For example, the semiconductor processing apparatus A may include a device to execute an atomic layer deposition (ALD) process on the wafer WF. The semiconductor processing apparatus A may be configured such that a deposition process may be simultaneously performed on a plurality of wafers WF. To achieve this configuration, the semiconductor processing apparatus A may include an outer tube 1, an inner tube 3, an insertion moving part 7, a lower tube 8, a nozzle isolation member 9, and a nozzle 5.

Referring to FIGS. 1 and 2, the outer tube 1 may have a shape that vertically extends over a certain length. The outer tube 1 may provide an upper space 1h. For example, the upper space 1h may be defined by the outer tube 1 having a shape that vertically extends. The outer tube 1 may include quartz, but the present inventive concepts are not limited thereto.

The inner tube 3 may be positioned in the outer tube 1. For example, the inner tube 3 may be placed in the upper space 1h. The inner tube 3 may have a shape that vertically extends over a certain length. The inner tube 3 may provide a process space 3h. The inner tube 3 may allow a gas injected from the nozzle (see 5 of FIG. 3) to concentrate on a predetermined region. For example, the inner tube 3 may limit a distribution area of the gas injected from the nozzle 5, and thus the gas may be prevented from escaping from the wafer WF. In some embodiments, the gas injected from the nozzle into the process space 3h may be concentrated to a predetermined concentration or pressure. The inner tube 3 may be designed to have a diameter greater than a diameter of the wafer WF. The inner tube 3 may include or may be formed of quartz. The inner tube 3 may include a sidewall 31, an upper member 33, and a lower member 35. The sidewall 31 may extend vertically. The sidewall 31 may limit (i.e., may define) a region into which a gas is injected from the nozzle 5. The sidewall 31 may provide a slit 3s. The slit 3s may be an aperture that penetrates the sidewall 31 and allows a gas injected from the nozzle 5 to enter the process space 3h. The process space 3h may be exposed through the slit 3s to the nozzle 5. The slit 3s may vertically extend over a certain length. The slit 3s will be further discussed in detail below. The upper member 33 may cover an upper side of the sidewall 31. The lower member 35 may separate the upper space 1h from a lower space 8h.

The insertion moving part 7 may accommodate the wafer WF. For example, the wafer WF may be disposed in the insertion moving part 7. The insertion moving part 7 may move vertically. In the case of upward movement of the insertion moving part 7 in which the wafer WF is accommodated, the wafer WF may be positioned in the process space 3h. In the case of downward movement of the insertion moving part 7, the wafer WF may be positioned in the lower space 8h. The insertion moving part 7 may include a boat 71, a rotatable member 73, a support member 75, a closing member 77, and a connection member 79. The wafer WF may be located in the boat 71. The boat 71 may provide a plurality of insertion grooves (not designated by a reference numeral). The plurality of insertion grooves may be vertically spaced apart from each other. A single insertion groove may receive a single wafer WF. The rotatable member 73 may rotate the boat 71. To achieve the rotation of the boat 71, the rotatable member 73 may include an actuator such as a motor. The support member 75 may support the boat 71. The closing member 77 may be disposed on the support member 75. When the insertion moving part 7 rises to place the boat 71 into the inner tube 3, the closing member 77 may contact a bottom surface of the lower member 35 of the inner tube 3. The closing member 77 may allow the process space 3h and the lower space 8h to separate from each other. The closing member 77 may include an O-ring. The connection member 79 may connect the support member 75 to a drive motor externally provided. The connection member 79 may cause the entirety of the insertion moving part 7 to move vertically. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The lower tube 8 may be positioned below the outer tube 1. The lower tube 8 may have a shape that vertically extends over a certain length. The lower tube 8 may provide the lower space 8h. For example, the lower space 8h may be defined by the lower tube 8 having a shape that extends vertically. The lower tube 8 may include or may be formed of quartz. The lower tube 8 and the outer tube 1 may be integrally formed into a single unitary piece, but the present inventive concepts are not limited thereto. When the insertion moving part 7 moves downwards, the insertion moving part 7 may be positioned in the lower tube 8. For example, the insertion moving part 7 may descend to enter the lower tube 8 or may ascend to enter the outer tube 1.

Referring to FIGS. 3 and 4, the nozzle isolation member 9 may be associated with an outer surface of the inner tube 3. The nozzle isolation member 9 may extend vertically. The nozzle isolation member 9 may provide a nozzle placement space 9h. The nozzle placement space 9h may extend vertically. The nozzle placement space 9h may be spatially connected through the slit 3s to the process space 3h. The nozzle 5 may be placed in the nozzle placement space 9h. The nozzle isolation member 9 and the inner tube 3 may be integrally formed into a single unitary piece, but the present inventive concepts are not limited thereto.

The nozzle 5 may be positioned between the outer tube 1 and the inner tube 3. For example, the nozzle 5 may be inserted into the nozzle isolation member 9 selected from an outer space of the inner tube 3. Accordingly, the nozzle 5 may be disposed in the nozzle placement space 9h. The nozzle 5 may be spaced apart from the inner tube 3. For example, the nozzle 5 may be outwardly spaced apart from an outer surface (see 3ES of FIG. 11) of the inner tube 3. The nozzle 5 may extends vertically. The nozzle 5 may provide an internal passage 5p and a hole 5h. The internal passage 5p may be a space that vertically extends within the nozzle 5. A process gas may move through the internal passage 5p. The hole 5h may be an aperture that penetrates a sidewall of the nozzle 5 and faces the slit 3s. The internal passage 5p may be spatially connected to the process space 3h through the hole 5h and the slit 3s. The hole 5h may be provided in plural. The plurality of holes 5h may be disposed vertically spaced apart from each other.

The slit 3s may vertically extend to horizontally overlap (i.e., to expose) at least two of the plurality of holes 5h. Therefore, the slit 3s may have an aspect ratio of greater than about 1. For example, the slit 3s may have a top end at a higher level than that of an uppermost one of at least two neighboring holes 5h. In addition, the slit 3s may have a bottom end at a lower level than that of a lowermost one of at least two neighboring holes 5h. Therefore, the slit 3s may expose at least two neighboring holes 5h. In some embodiments, the slit 3s may vertically extend to horizontally overlap (i.e., to expose) all of the holes 5h that are included in a single nozzle 5. Accordingly, a process gas injected from all of the holes 5h included in a single nozzle 5 may be introduced through a single slit 3s into the process space 3h. A detailed description thereof will be further discussed below. In this description below, unless otherwise stated, a single hole 5h will be discussed in the interest of convenience.

Figure 5:
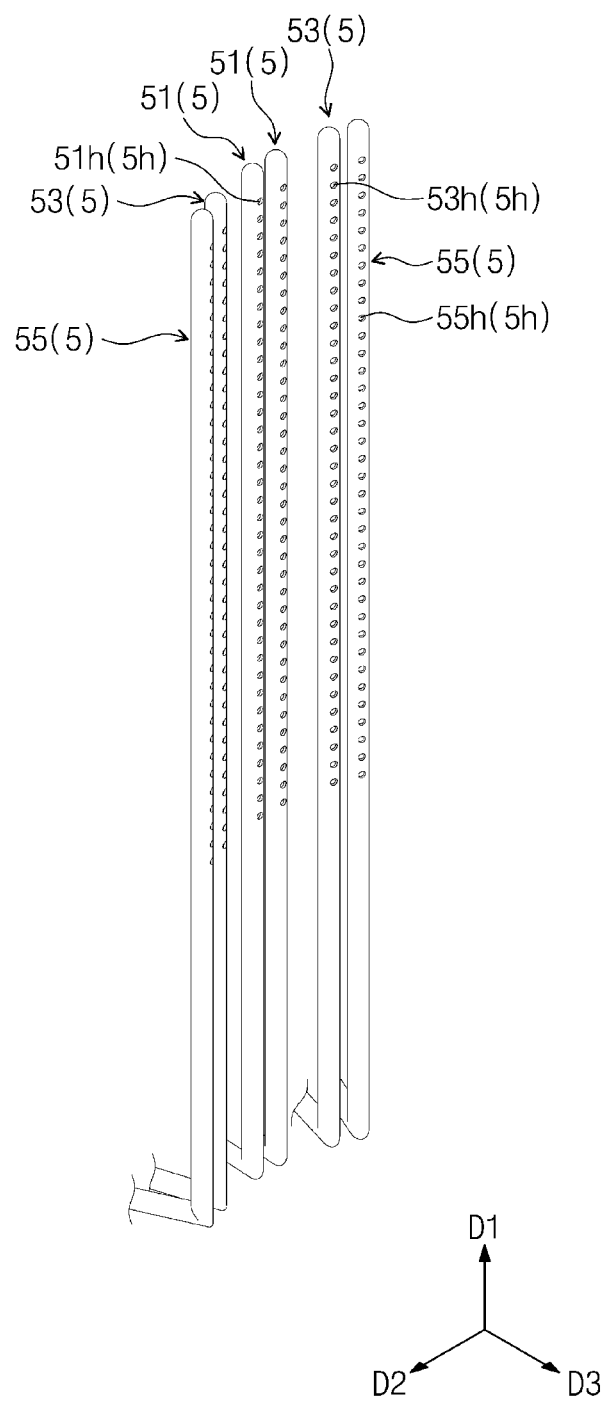
FIG. 5 illustrates a perspective view showing nozzles according to some embodiments of the present inventive concepts.

FIG. 5 illustrates a perspective view showing nozzles according to some embodiments of the present inventive concepts.

Referring to FIG. 5, the nozzle 5 may be provided in plural. The plurality of nozzles 5 may be horizontally spaced apart from each other. The nozzles 5 may include a first nozzle 51, a second nozzle 53, and a third nozzle 55. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first nozzle 51 may provide a first hole 51h. The first nozzle 51 may be a straight type nozzle. The first nozzle 51 may receive a process gas that is introduced along a connection tube connected to a bottom end of the first nozzle 51. The process gas may rise along the first nozzle 51 and may be injected through the first hole 51h. A first process gas may refer to the process gas that is sprayed while moving along the first nozzle 51. A detailed description thereof will be further discussed below. The first nozzle 51 may be provided in two pieces. The two first nozzles 51 may be spaced apart from each other in a horizontal direction. In this description below, a single first nozzle 51 will be discussed for convenience.

The second nozzle 53 may be adjacent to a side of the first nozzle 51. For example, the second nozzle 53 may be horizontally spaced apart from the first nozzle 51 such that the second nozzle 53 may neighbor the first nozzle 51. The second nozzle 53 may be a straight type nozzle. The second nozzle 53 may provide a second hole 53h. The second nozzle 53 may inject a process gas through the second hole 53h. A second process gas may refer to the process gas that is sprayed while moving along the second nozzle 53. The second process gas may be different from the first process gas. A detailed description thereof will be further discussed below. The second nozzles 53 may be provided in two pieces. The two second nozzles 53 may be positioned in opposite directions across the first nozzle 51. In this description below, a single second nozzle 53 will be discussed for convenience.

The third nozzle 55 may be adjacent to a side of the second nozzle 53. For example, the third nozzle 55 may be horizontally spaced apart from the second nozzle 53 such that the third nozzle 55 may neighbor the second nozzle 53. The third nozzle 55 may be a straight type nozzle. The third nozzle 55 may provide a third hole 55h. The third nozzle 55 may inject a process gas through the third hole 55h. A third process gas may refer to the process gas that is sprayed while moving along the third nozzle 55. The third process gas may be different from each of the first process gas and the second process gas. A detailed description thereof will be further discussed below. The third nozzles 55 may be provided in two pieces. In this description below, a single third nozzle 55 will be discussed for convenience.

Figure 6:
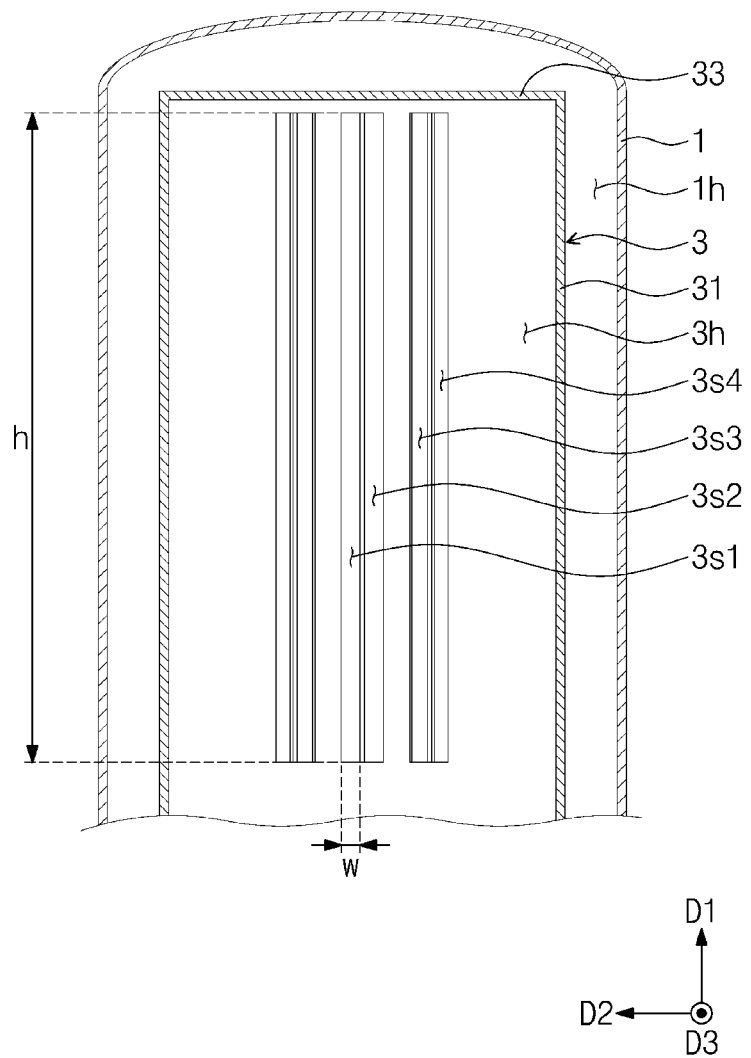
FIG. 6 illustrates a cross-sectional view showing a semiconductor processing apparatus according to some embodiments of the present inventive concepts.
Figure 7:
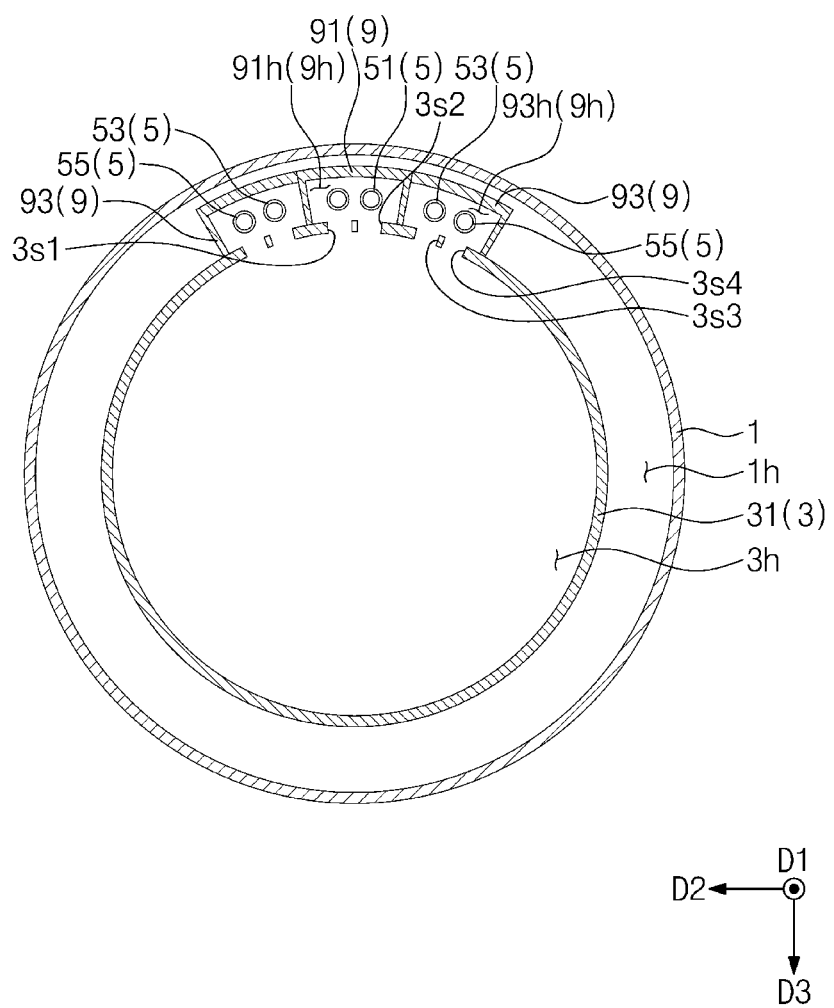
FIG. 7 illustrates a top view showing a semiconductor processing apparatus according to some embodiments of the present inventive concepts.

FIG. 6 illustrates a cross-sectional view showing a semiconductor processing apparatus according to some embodiments of the present inventive concepts. FIG. 7 illustrates a top view showing a semiconductor processing apparatus according to some embodiments of the present inventive concepts.

Referring to FIG. 7, the nozzle isolation member 9 may be provided in plural. The plurality of nozzle isolation members 9 may be horizontally spaced apart from each other. The nozzle isolation members 9 may include a first nozzle isolation member 91 and a second nozzle isolation member 93. The first nozzle isolation member 91 may provide a first nozzle placement space 91h. The first nozzle 51 may be positioned in the first nozzle placement space 91h. The second nozzle isolation member 93 may provide a second nozzle placement space 93h. One of each of the second and third nozzles 53 and 55 may be positioned in the second nozzle placement space 93h. The second nozzle isolation member 93 may be provided in two pieces. The two second nozzle isolation members 93 may be positioned in opposite directions across the first nozzle isolation member 91. For example, the first nozzle isolation member 91 may be disposed between the two second nozzle isolation members 93. One of the two second nozzle isolation members 93 may be adjacent to a first side of the first nozzle isolation member 91, and the other of the two second nozzle isolation members 93 may be adjacent to a second side, opposite to the first side, of the first nozzle isolation member 91. Each of the two second nozzle isolation members 93 may accommodate one of the two second nozzles 53 and one of the two third nozzles 55. For example, the first nozzle isolation member 91 may accommodate the first nozzle 51 spraying the first process gas, and the second isolation member 93 may accommodate the second and third nozzles spraying the second and third process gases different from each other, respectively.

Referring to FIGS. 6 and 7, the slit 3s may be provided in plural. The plurality of slits 3s may be horizontally spaced apart from each other. The slits 3s may include a first slit 3s1, a second slit 3s2, a third slit 3s23, and a fourth slit 3s4. The first slit 3s1 may be opened to (i.e., may expose) the first nozzle 51. For example, the first slit 3s1 may be opened to one of the two first nozzles 51 (see FIG. 5). The second slit 3s2 may be opened to the first nozzle 51. For example, the second slit 3s2 may be opened to the other (e.g., a right first nozzle) of the two first nozzles 51 (see FIG. 5). Each of the first and second slits 3s1 and 3s2 may be spatially connected to the first nozzle placement space 91h. The third slit 3s3 may be opened to the second nozzle 53. The third slit 3s3 may be spatially connected to the second nozzle placement space 93h. When the second nozzle 53 is provided in two pieces, the third slit 3s3 may also be provided in two pieces. The fourth slit 3s4 may be opened to the third nozzle 55. The fourth slit 3s4 may be spatially connected to the second nozzle placement space 93h. When the third nozzle 55 is provided in two pieces, the fourth slit 3s4 may also be provided in two pieces.

Referring back to FIG. 6, the slit 3s may have an aspect ratio of greater than about 1. For example, because the slit 3s vertically extends to horizontally overlap (i.e., to expose) two or more of the plurality of holes (see 5h of FIG. 5), the slit 3s may have a height greater than a width thereof. With regard to the first slit 3s1, the first slit 3s1 may have a height h greater than a width w of the first slit 3s1. The width w of the first slit 3s1 may range from about 5 mm to about 60 mm. The height h of the first slit 3s1 may be greater than about 60 mm Similar to the first slit 3s1, each of the second and third slits 3s2 and 3s3 may have an aspect ratio of greater than about 1. The aspect ratio of the slit 3s may refer to a ratio of the height h to the width w. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In this description below, unless otherwise stated, a single slit 3s and a single nozzle isolation member 9 will be discussed in the interest of convenience.

Figure 8:
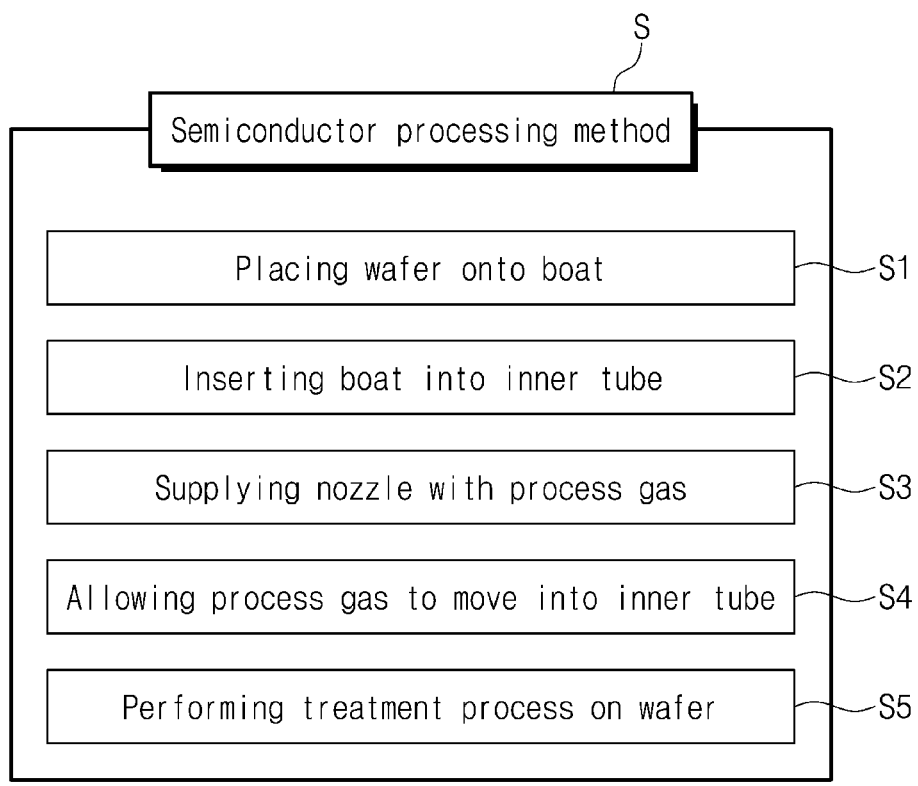
FIG. 8 illustrates a flow chart showing a semiconductor processing method according to some embodiments of the present inventive concepts.

FIG. 8 illustrates a flow chart showing a semiconductor processing method according to some embodiments of the present inventive concepts.

Referring to FIG. 8, a semiconductor processing method S may be provided. The semiconductor processing method S may be a wafer processing method that uses the semiconductor processing apparatus A discussed with reference to FIGS. 1 to 7. The semiconductor processing method S may include a step S1 of placing a wafer on a boat, a step S2 of inserting the boat into an inner tube, a step S3 of supplying a nozzle with a process gas, a step S4 of allowing the process gas to move into the inner tube, and a step S5 of performing a treatment process on the wafer.

The following will describe in detail the semiconductor processing method S of FIG. 8 with reference to FIGS. 9 to 13.

FIGS. 9 to 13 illustrate cross-sectional and top views showing a semiconductor processing method discussed with reference to the flow chart of FIG. 8.

Figure 9:
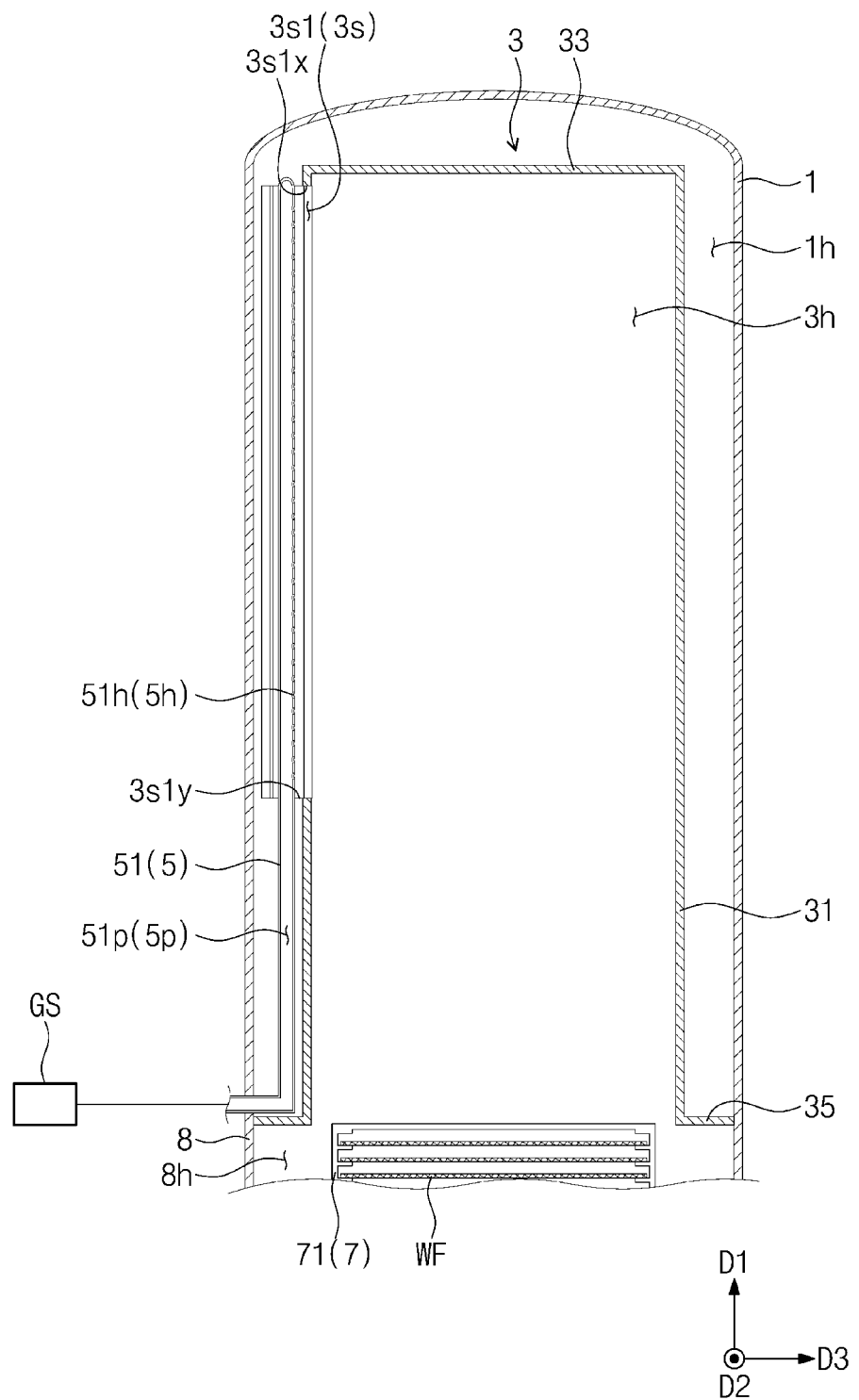
FIGS. 9 to 13 illustrate cross-sectional and top views showing a semiconductor processing method discussed with reference to the flow chart of FIG. 8.

Referring to FIGS. 8 and 9, the wafer placement step S1 may include a process step in which the wafer WF is placed on the boat 71 under a condition where the insertion moving part 7 is present at a lower position (i.e., at the lower space 8h). For example, the wafer WF may be disposed in the insertion groove of the boat 71 under a condition where the insertion moving part 7 is positioned in the lower tube 8. Because the boat 71 is provided with a plurality of insertion grooves, a plurality of wafers WF may be placed in the boat 71. The plurality of wafers WF may be disposed vertically spaced apart from each other. The first slit 3s1 vertically extends to horizontally overlap (i.e., to expose) all of the first holes 51h of the first nozzle 51, and the first slit 3s1 may have a top end 3s1x at a higher level than a level of an uppermost first hole of the plurality of first holes 51h included in the first nozzle 51. In addition, the first slit 3s1 may have a bottom end 3s1y at a lower level than a level of a lowermost first hole of the plurality of first holes 51h included in the first nozzle 51. The present inventive concepts, however, are not limited thereto, and the slit 3s may horizontally overlap (i.e., may expose) only two holes 5h without exposing all of the holes 5h included in the nozzle 5.

Figure 10:
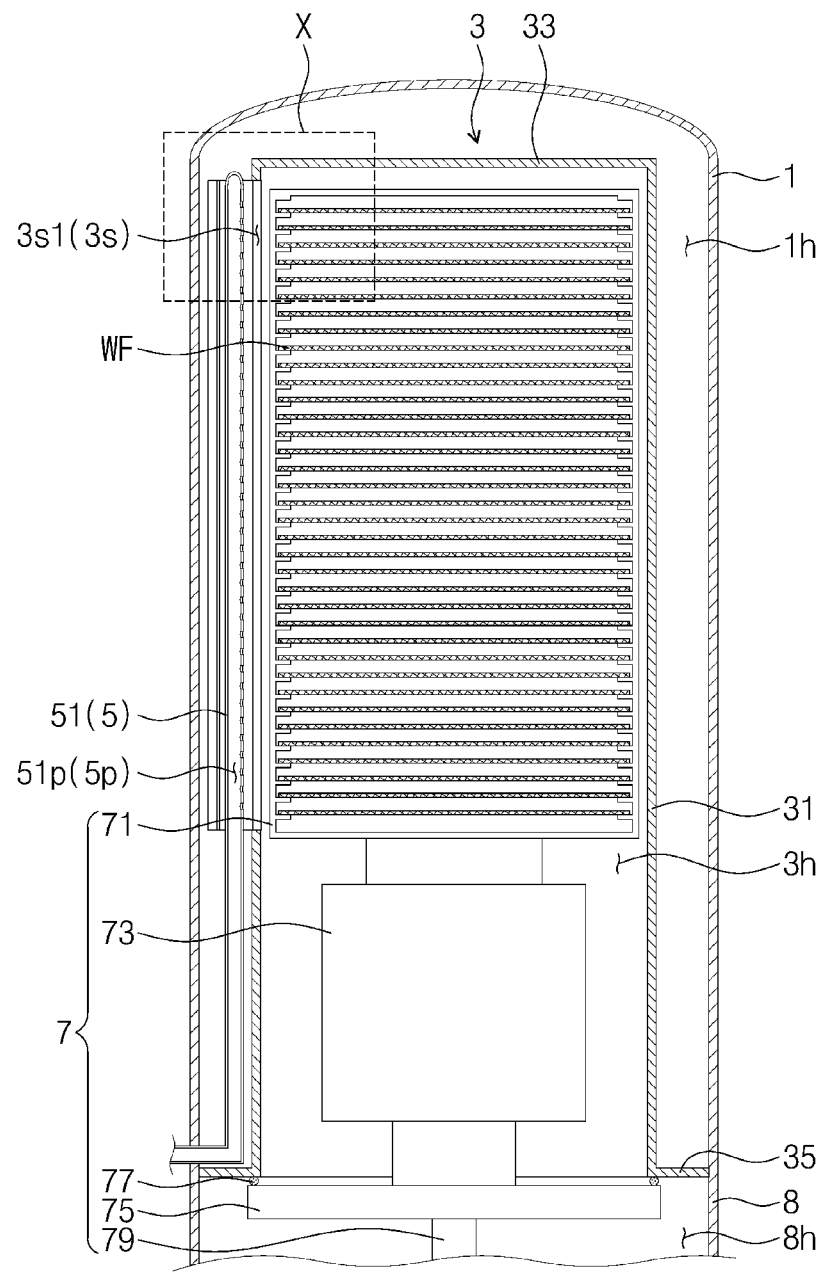
Figure 10:
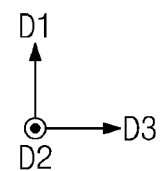

Referring to FIGS. 8 and 10, the boat insertion step S2 may include a process step in which the insertion moving part 7 rises to insert the boat 71 into the inner tube 3. For example, the connection member 79 may upwardly move the insertion moving part 7 and thus the boat 71 may be positioned in the process space 3h. The insertion moving part 7 may rise to cause the boat 71 to approach a front side of the slit 3s. The closing member 77 may contact a bottom surface of the lower member 35. The closing member 77 may separate the process space 3h from the lower space 8h.

Figure 11:
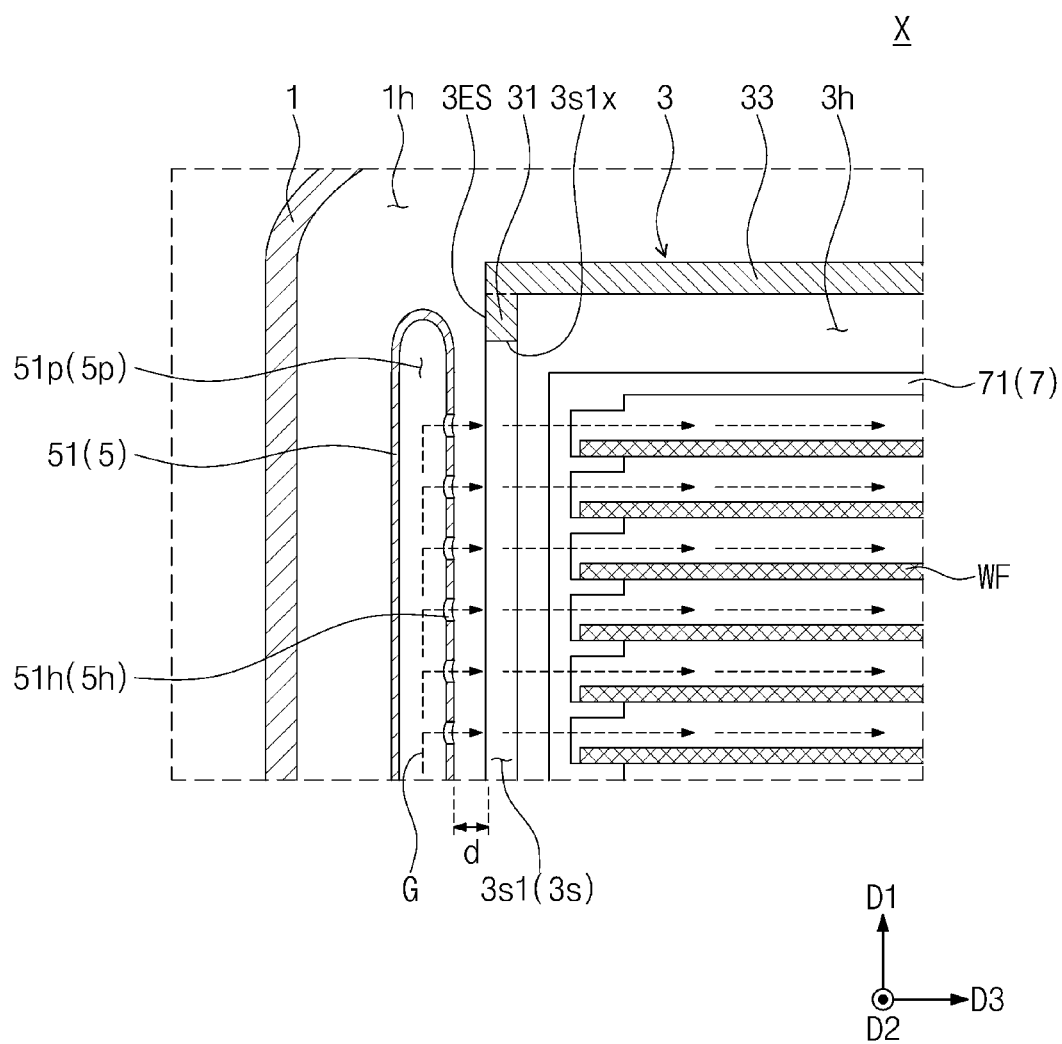

Referring to FIGS. 8 and 11, the gas supply step S3 may include a process step in which a process gas is supplied into the internal passage 5p of the nozzle 5. For example, a process gas G may be supplied into a first internal passage 51p of the first nozzle 51. The process gas G supplied to the first nozzle 51 may be the first process gas. The process gas G may move upwards along the first internal passage 51p.

The gas movement step S4 may include that the process gas G is discharged through the hole 5h from the nozzle 5. For example, the process gas G in the first internal passage 51p may be outwardly injected through the first hole 51h from the first nozzle 51. The process gas G discharged through the first hole 51h from the first nozzle 51 may move in a horizontal direction toward the first slit 3s1. The nozzle 5 may be horizontally spaced apart from an outer surface 3ES of the inner tube 3. For example, the nozzle 5 may be spaced apart at a first distance d from the outer surface 3ES of the inner tube 3. Therefore, the process gas G discharged through the hole 5h may enter the slit 3s after moving in a horizontal direction over the first distance d. As the slit 3s vertically extends to horizontally overlap (i.e., to expose) a plurality of holes 5h, the process gas G may not collide with the outer surface 3ES of the inner tube 3 even when the process gas G discharged the hole 5h spreads upwards and/or downwards. In some embodiments, the first distance d may be set such that a portion of the process gas G that spreads upwards and/or downwards through hole 5h does not collide with the outer surface 3ES of the inner tube 3. The process gas G discharged through the first nozzle 51 may be introduced through the first slit 3s1 into the process space 3h. The process gas G introduced into the process space 3h may be distributed onto the wafer WF. The number and height of the hole 5h and the wafer WF may be designed to cause one wafer WF to correspond to one hole 5h. In some embodiments, each of the holes 5h may be directed toward a space between corresponding two adjacent wafers so that a portion of the process gas G injected from each hole 5h may be injected into the space.

Figure 12:
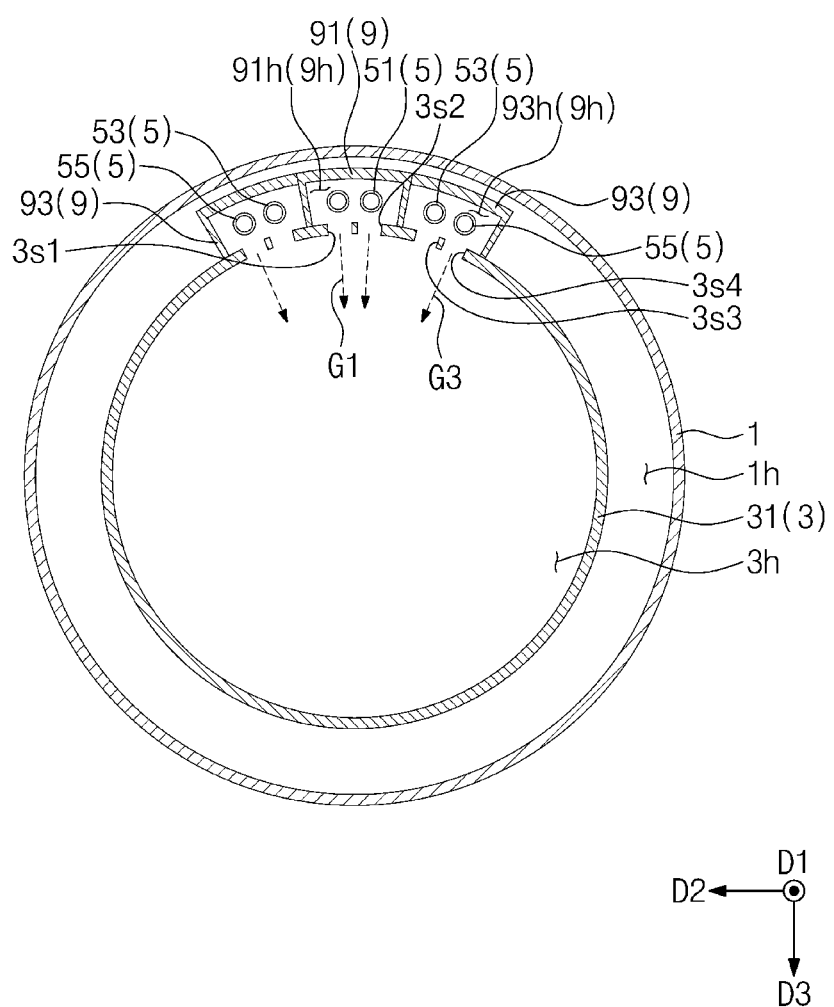
Figure 13:
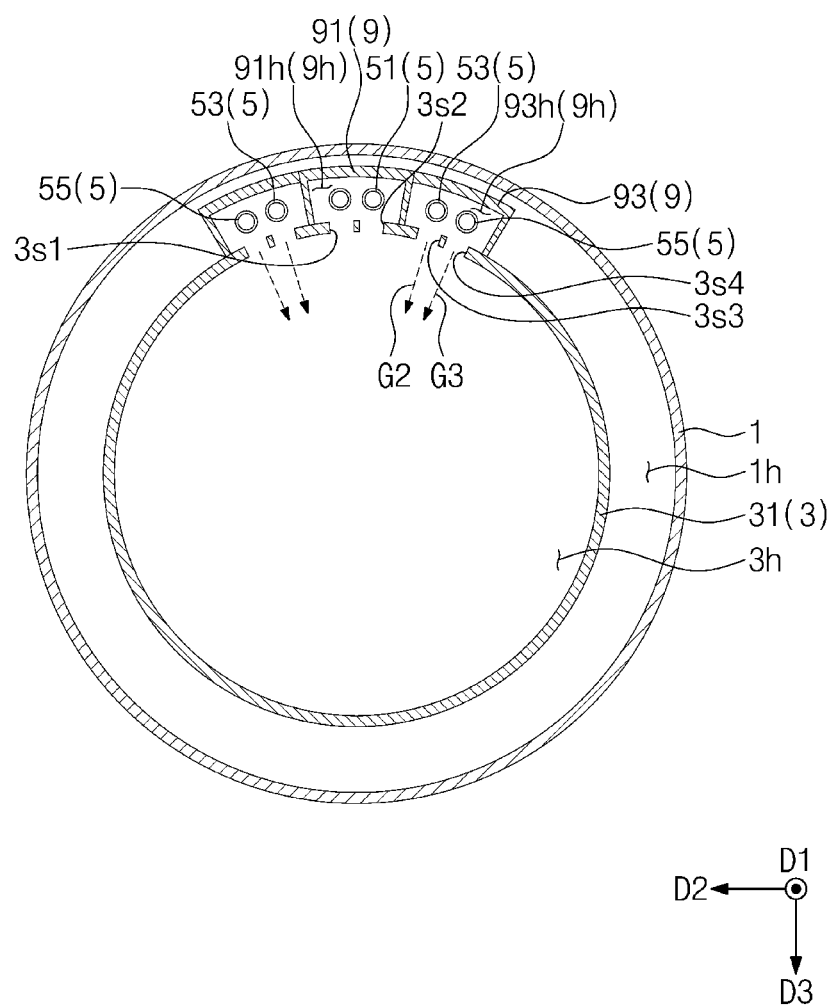

Referring to FIGS. 8, 12, and 13, the wafer process step S5 may include that various process gases are simultaneously or sequentially injected and deposited on a wafer. For example, as shown in FIG. 12, a first process gas G1 may be injected from the first nozzle 51 and may then be introduced into the process space 3h through the first slit 3s1 and the second slit 3s2. Concurrently, a third process gas G3 may be injected from the third nozzle 55 and may then be introduced through the fourth slit 3s4 into the process space 3h. The third process gas G3 may control distribution of the first process gas G1. Then, a second process gas G2 may be injected from the second nozzle 53 and may then be introduced through the third slit 3s3 into the process space 3h. Concurrently, the third process gas G3 may be injected from the third nozzle 55 and may then be introduced through the fourth slit 3s4 into the process space 3h. The third process gas G3 may control distribution of the second process gas G2. The second process gas G2 and the pre-introduced first process gas G1 may react with each other to be deposited on the wafer WF. Some of the plurality of nozzles 5 may be positioned in different nozzle placement spaces 9h. Therefore, various process gases may be prevented from meeting each other in the nozzle placement space 9h. For example, because the first nozzle 51 is positioned in the first nozzle isolation member 91, and because the second nozzle 53 is positioned in the second nozzle isolation member 93, the first process gas G1 injected from the first nozzle 51 may be prevented from moving to the vicinity of the second nozzle 53. In addition, the second process gas G2 injected from the second nozzle 53 may be prevented from moving to the vicinity of the first nozzle 51. Therefore, the first process gas G1 and the second process gas G2 may be prevented from meeting each other in one or both of the first nozzle placement space 91h and the second nozzle placement space 93h.

According to semiconductor processing apparatuses and methods in accordance with some embodiments of the present inventive concepts, a nozzle may be outwardly spaced apart from an inner tube. For example, the nozzle may not be directly associated with an outer surface of the inner tube. Therefore, it may be possible to change a relative distance and/or angle between the nozzle and the inner tube. In this case, a position and/or angle of the nozzle may be changed to adjust a facing direction of a hole. Thus, it may be possible to control a moving direction of a process gas injected from the hole. For example, when adjustment of an injection direction of the process gas is needed to control a process variation at a wafer, an arrangement angle of the nozzle may be varied to adjust the injection direction of the process gas. Accordingly, injection of the process gas may be adjusted to control a process variation in each fabrication process.

According to semiconductor processing apparatuses and methods in accordance with some embodiments of the present inventive concepts, the process gas injected from the nozzle may be introduced through a slit into a process space of the inner tube. In this case, the slit may vertically extend to horizontally overlap (i.e., to expose) a plurality of holes, and thus the process gas injected from the hole may be prevented from colliding with the outer surface of the inner tube. As discussed above, the nozzle may be outwardly spaced apart from the inner tube. Therefore, the process gas injected from the nozzle may diffuse vertically before being introduced into the process space. For example, until the process gas enters the slit after being discharged from the hole, the process gas may spread upwards and/or downwards without traveling straight only in a horizontal direction. As the slit of the inner tube according to the present inventive concepts vertically extends to horizontally overlap (i.e., to expose) a plurality of holes, even when the process gas is distributed vertically, the process gas may be prevented from colliding with the outer surface of the inner tube. Thus, the process gas escaped from the nozzle may be prevented from being introduced into an undesired region without being introduced into the inner tube. Therefore, a large amount of process gas may be distributed onto the wafer. For example, although a supply amount of process gas is maintained at a certain flow rate without increasing the gas supply amount, the wafer may receive an increasing amount of process gas that reaches a top surface of the wafer. Accordingly, an efficiency of deposition process on the wafer may increase and a process variation at the wafer may be reduced.

Figure 14:
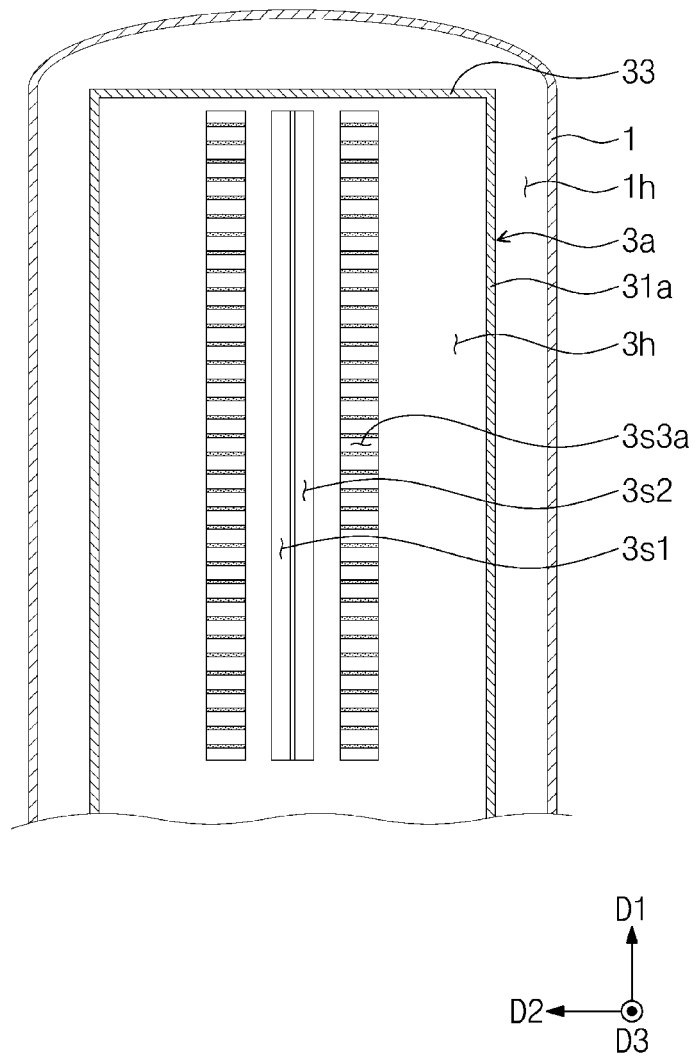
FIG. 14 illustrates a cross-sectional view showing a semiconductor processing apparatus according to some embodiments of the present inventive concepts.

FIG. 14 illustrates a cross-sectional view showing a semiconductor processing apparatus according to some embodiments of the present inventive concepts.

For the convenience of description, descriptions of components substantially the same as or similar to that discussed with reference to FIGS. 1 to 13 will be omitted.

Referring to FIG. 14, an inner tube 3a may include a first slit 3s1 and a second slit 3s2 provided at a sidewall 31a of the inner tube 3, and each of the first and second slits 3s1 and 3s2 may be substantially the same as or similar to that discussed with reference to FIG. 6. In contrast, a third slit 3s3a may have an aspect ratio of less than about 1. For example, the third slit 3s3a may horizontally overlap (i.e., may expose) only one hole (see 5h of FIG. 5). The third slit 3s3a may be provided in plural. For example, the number of the plurality of third slits 3s3a may be the same as the number of the holes 5h provided in one nozzle (see 5 of FIG. 5). The plurality of third slits 3s3a may be vertically spaced apart from each other.

Figure 15:
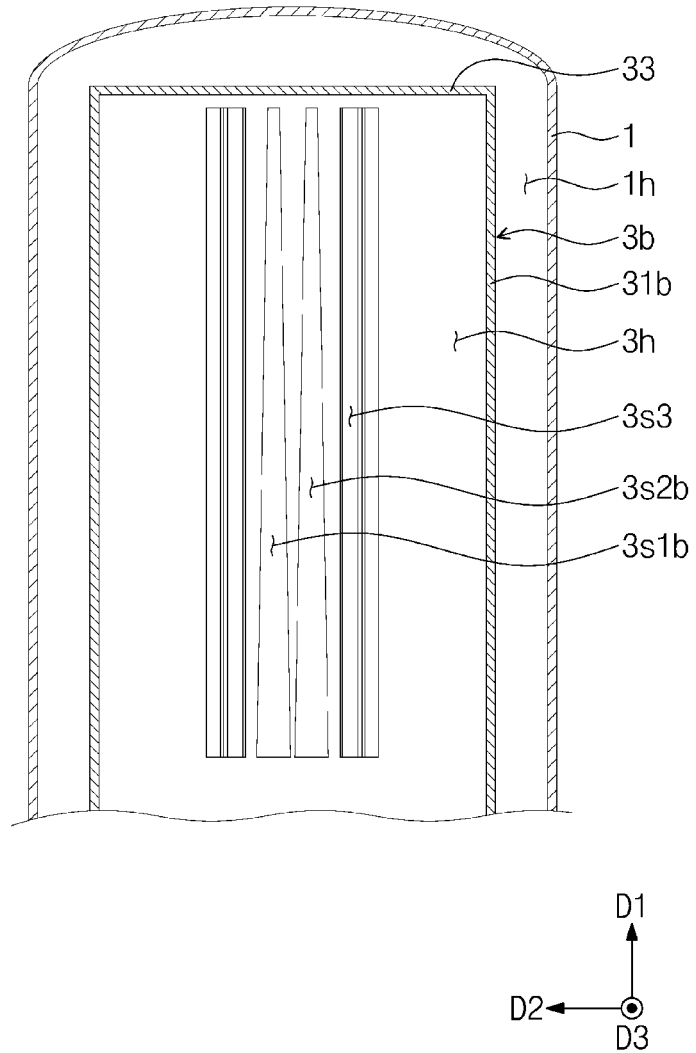
FIG. 15 illustrates a cross-sectional view showing a semiconductor processing apparatus according to some embodiments of the present inventive concepts.

FIG. 15 illustrates a cross-sectional view showing a semiconductor processing apparatus according to some embodiments of the present inventive concepts.

For the convenience of description, descriptions of components substantially the same as or similar to that discussed with reference to FIGS. 1 to 14 will be omitted.

Referring to FIG. 15, a first slit 3s1b may have an irregular width. For example, a width at a top end of the first slit 3s1b may be different from a width at a bottom end of the first slit 3s1b. In some embodiments, the width at the top end of the first slit 3s1b may be less than that at the bottom end of the first slit 3s1b. In some embodiments, the width of the first slit 3s1b may increase in a direction from the top end of the first slit 3s1b to the bottom end of the first slit 3s1b. A second slit 3s2b may be configured similarly to the first slit 3s1b.

According to semiconductor processing apparatuses and methods in accordance with some embodiments of the present inventive concepts, a silt may have a width that increases in a downward direction. Therefore, a large amount of process gas may be easily introduced through a lower portion of the slit into a process space of an inner tube. Accordingly, a large amount of a process gas may reach a wafer disposed in a lower portion of a boat. For example, when an amount of the process gas that reaches the wafer disposed in a lower portion of the boat is less than an amount of the process gas that reaches a wafer disposed in an upper portion of the boat, the slit depicted in FIG. 15 may be used to reduce a difference in amount of process. Accordingly, it may be possible to minimize a process variation at a wafer.

Figure 16:
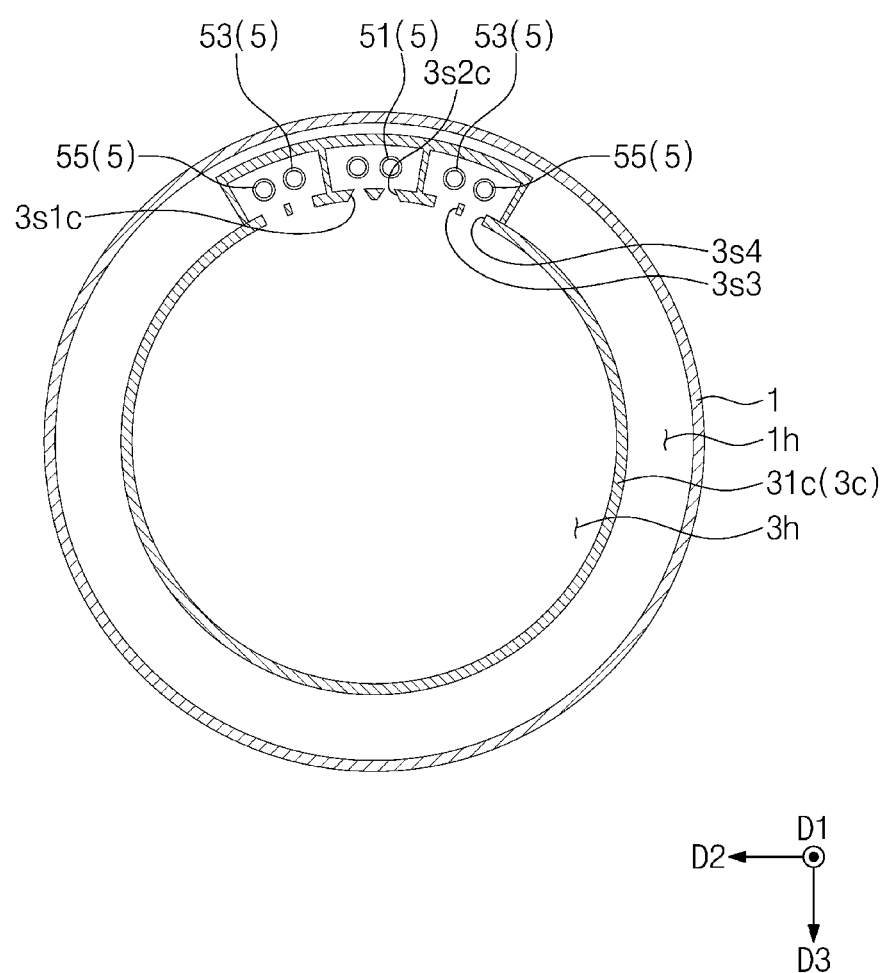
FIG. 16 illustrates a top view showing a semiconductor processing apparatus according to some embodiments of the present inventive concepts.

FIG. 16 illustrates a cross-sectional view showing a semiconductor processing apparatus according to some embodiments of the present inventive concepts.

For the convenience of description, descriptions of components substantially the same as or similar to that discussed with reference to FIGS. 1 to 15 will be omitted.

Referring to FIG. 16, a first slit $3s1c$ at a portion connected to an outer surface of the inner tube $3c$ may have a width different from a width of the first slit $3s1c$ at a portion connected to an inner surface of the inner tube $3c$. For example, the width of the first slit $3s1c$ at the portion connected to the inner surface of the inner tube $3c$ may be greater than the width of the first slit $3s1c$ at the portion connected to the outer surface of the inner tube $3c$. In some embodiments, the first slit $3s1c$ may have a width that increases in a direction from the outer surface of the inner tube $3c$ to the inner surface of the inner tube $3c$.

According to semiconductor processing apparatuses and methods in accordance with some embodiments of the present inventive concepts, a slit may be designed to have an increasing width toward the process space of the inner tube. Therefore, a process gas that passes through the slit may be controlled in its speed and distribution. Accordingly, it may be possible to minimize a process variation at a wafer.

Figure 17:
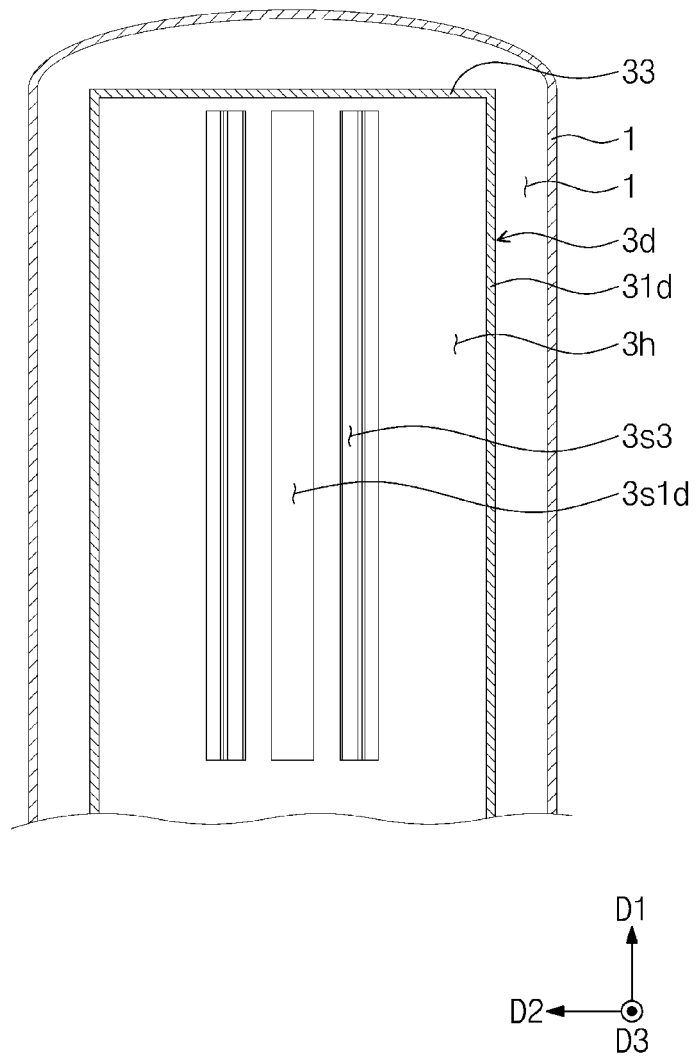
FIG. 17 illustrates a cross-sectional view showing a semiconductor processing apparatus according to some embodiments of the present inventive concepts.

FIG. 17 illustrates a cross-sectional view showing a semiconductor processing apparatus according to some embodiments of the present inventive concepts.

For the convenience of description, descriptions of components substantially the same as or similar to that discussed with reference to FIGS. 1 to 16 will be omitted.

Referring to FIG. 17, a first slit $3s1d$ may horizontally extend to expose all of two first nozzles (see 51 of FIG. 5). For example, the first slit $3s1d$ of FIG. 17 may have a shape obtained by adding a shape of the first slit $3s1$ to a shape of the second slit $3s2$ discussed with reference to FIG. 6.

According to semiconductor processing apparatuses and methods of the present inventive concepts, a wafer may be supplied with a process gas whose amount is large even at a certain flow rate.

According to semiconductor processing apparatuses and methods of the present inventive concepts, it may be possible to minimize a process variation at a wafer.

According to semiconductor processing apparatuses and methods of the present inventive concepts, a process gas may be uniformly supplied to all of wafers disposed in upper and lower portions of a boat.

Effects of the present inventive concepts are not limited to the mentioned above, other effects which have not been mentioned above will be clearly understood to those skilled in the art from the following description.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A semiconductor processing apparatus, comprising:
an outer tube;
an inner tube in the outer tube, the inner tube providing a process space; and
a first nozzle and a second nozzle between the outer tube and the inner tube, each of the first nozzle and the second nozzle providing an internal passage,
wherein the inner tube provides a first slit and a second slit spaced apart from each other in a horizontal direction,
wherein each of the first nozzle and the second nozzle provides a plurality of holes,
wherein the plurality of holes of the first nozzle face the first slit,
wherein the plurality of holes of the second nozzle face the second slit,
wherein the plurality of holes are vertically spaced apart from each other,
wherein the first slit vertically extends to expose at least two holes of the plurality of holes of the first nozzle,
wherein the second slit vertically extends to expose at least two holes of the plurality of holes of the second nozzle, and
wherein the internal passage is connected to the process space through the first and second slits and the plurality of holes.

2. The apparatus of claim 1,
wherein the first slit vertically extends to expose all of the plurality of holes of the first nozzle.

3. The apparatus of claim 1,
wherein a width of the first slit is between about 5 mm and about 60 mm.

4. The apparatus of claim 1,
wherein the first nozzle is spaced apart from an outer surface of the inner tube.

5. The apparatus of claim 4, further comprising:
a nozzle isolation member associated with the outer surface of the inner tube,
wherein the nozzle isolation member provides a nozzle placement space that extends vertically,
wherein the nozzle placement space is connected through the first and second slits to the process space, and
wherein the first and second nozzles are in the nozzle placement space.

6. The apparatus of claim 1,
wherein the plurality of holes of the first nozzle injects a first process gas,
wherein the plurality of holes of the second nozzle injects a second process gas, and
wherein the first process gas and the second process gas are different from each other.

7. The apparatus of claim 1,
wherein a width at a top end of the first slit is different from a width at a bottom end of the first slit.

8. The apparatus of claim 7,
wherein a width of the first slit increases in a direction from the top end to the bottom end.

9. A semiconductor processing apparatus, comprising:
an outer tube;
an inner tube in the outer tube; and
a first nozzle and a second nozzle that vertically respectively extends between the outer tube and the inner tube,
wherein the inner tube provides a first slit and a second slit that respectively extends vertically,
wherein each of the first and second nozzles provides a hole,
wherein the hole of the first nozzle face the first slit and is exposed through the first slit, wherein the hole of the second nozzle face the second slit and is exposed through the second slit, wherein a ratio between a height of the first slit and a width at a bottom end of the first slit is greater than about 1, and wherein the first nozzle is spaced apart from an outer surface of the inner tube.

10. The apparatus of claim 9, wherein the first slit includes a first portion connected to the outer surface of the inner tube and a second portion connected to an inner surface of the inner tube, and wherein a width of the first portion of the first slit is different from a width of the second portion of the first slit.

11. The apparatus of claim 10, wherein a width of the first slit increases in a direction from the first portion connected to the outer surface of the inner tube toward the second portion connected to the inner surface of the inner tube.

12. The apparatus of claim 9, wherein the hole is provided in plural, and wherein the plurality of holes are vertically spaced apart from each other.

13. The apparatus of claim 12, wherein the first slit vertically extends to expose all of the plurality of holes of the first nozzle.

14. The apparatus of claim 9, further comprising:

a nozzle isolation member that is connected to the outer surface of the inner tube and extends vertically, wherein the nozzle isolation member provides a nozzle placement space, wherein the nozzle placement space is connected through the first and second slits to an inside of the inner tube, and wherein the first and second nozzles is inserted into the nozzle isolation member.

15. The apparatus of claim 14, wherein the hole is provided in plural, wherein the plurality of holes of the first nozzle injects a first process gas, wherein the plurality of holes of the second nozzle injects a second process gas, and wherein the first process gas and the second process gas are different from each other.

16. The apparatus of claim 15, further comprising:

a third nozzle and a fourth nozzle that vertically respectively extends between the outer tube and the inner tube, wherein the inner tube provides a third slit and a fourth slit, wherein the nozzle isolation member includes:

a first nozzle isolation member; and a second nozzle isolation member, wherein the first nozzle isolation member is connected through the first and second slits to the inside of the inner tube, wherein the second nozzle isolation member is connected through the third and fourth slits to the inside of the inner tube, wherein the first and second nozzles are inserted into the first nozzle isolation member, and wherein the third and fourth nozzles are inserted into the second nozzle isolation member.

17. The apparatus of claim 9, wherein a width at a top end of the first slit is different from the width at the bottom end of the first slit.

* * * * *